United States Patent
Wang et al.

(10) Patent No.: US 7,018,883 B2
(45) Date of Patent: Mar. 28, 2006

(54) DUAL WORK FUNCTION GATE ELECTRODES

(75) Inventors: Chih-Hao Wang, Hsin-Chu (TW); Tzung-Lin Li, Pingtung (TW); Yen-Ping Wang, Taipei (TW); Chun-Yen Chang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 38 days.

(21) Appl. No.: 10/839,430

(22) Filed: May 5, 2004

(65) Prior Publication Data

US 2005/0250271 A1     Nov. 10, 2005

(51) Int. Cl.
*H01L 21/8238* (2006.01)
(52) U.S. Cl. .............. 438/199; 438/587; 257/369
(58) Field of Classification Search ............... None
See application file for complete search history.

(56) References Cited

U.S. PATENT DOCUMENTS

| | | | |
|---|---|---|---|
| 6,653,698 B1 | 11/2003 | Lee et al. | |
| 6,861,712 B1 * | 3/2005 | Gao et al. | 257/369 |
| 6,872,613 B1 * | 3/2005 | Xiang et al. | 438/199 |
| 2004/0245578 A1 * | 12/2004 | Park et al. | 257/369 |

* cited by examiner

*Primary Examiner*—Dung A. Le
(74) *Attorney, Agent, or Firm*—Haynes and Boone, LLP

(57) ABSTRACT

Methods of manufacturing transistor gate electrodes including, in one embodiment, forming a metal layer over first and second regions of a substrate, wherein the first and second regions have different first and second dopant types, respectively. A semiconductor layer is formed over at least a portion of the second region. The metal layer is heated to form a metal gate electrode over the first region, and the metal layer and the semiconductor layer are collectively heated to form a composite metal gate electrode over the second region.

22 Claims, 3 Drawing Sheets

DUAL WORK FUNCTION GATE ELECTRODES

BACKGROUND

Doped polysilicon is often employed as the gate material for complimentary metal-oxide-semiconductor (CMOS) devices because doped polysilicon enables the formation of dual work function devices needed for CMOS devices. For example, dual work function devices may be produced by doping the polysilicon gates differently depending on the specific device being formed. A dual work function is required because CMOS devices include both N channel transistors (NFETs) and P channel transistors (PFETs) which operate at different threshold voltages, and the threshold voltage of a transistor is directly related to the work function of the gate material, among other factors.

However, semiconductor technology is advancing towards replacing doped polysilicon gates with gates that substantially comprise metal. Hence, obtaining a dual work function configuration requires forming NFET gates that comprise one metal and PFET gates that comprise another metal.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
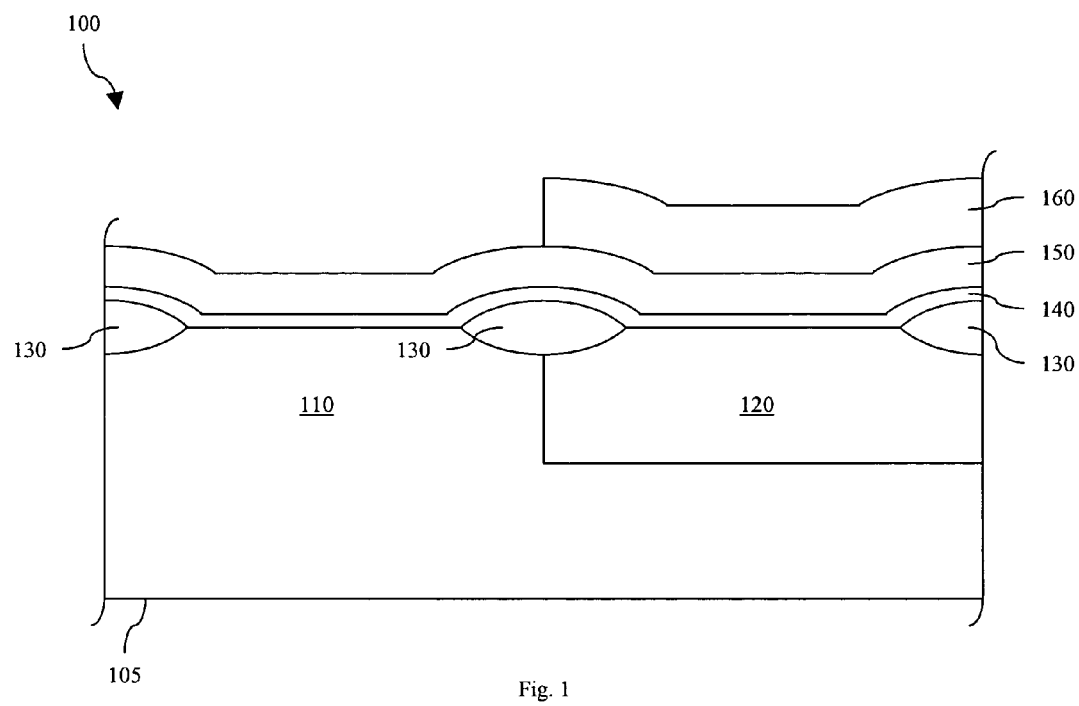
FIG. 1 is a sectional view of at least a portion of one embodiment of a microelectronic device in an intermediate stage of manufacture according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a sectional view of at least a portion of one embodiment of a microelectronic device 100 in an intermediate stage of manufacture according to aspects of the present disclosure. The device 100 includes doped regions 110, 120 formed in a substrate 105. The substrate 105 may comprise silicon, gallium arsenide, gallium nitride, strained silicon, silicon germanium, silicon carbide, carbide, diamond, and/or other materials. A bulk portion of the substrate 105 may be doped with a P type and/or an N type dopant. In one embodiment, the substrate 105 comprises a silicon-on-insulator (SOI) substrate, such as a silicon-on-sapphire substrate, a silicon germanium-on-insulator substrate, or another substrate comprising an epitaxial or otherwise formed semiconductor layer on an insulator layer. The substrate 105 may also or alternatively comprise a fully depleted SOI substrate having an active layer thickness ranging between about 5 nm and about 200 nm. The substrate 105 may also or alternatively comprise an air gap, such as may be formed in a "silicon-on-nothing" (SON) structure.

The doped regions 110, 120 may be regions formed by implanting impurities into the substrate 105 employing a mask defining or approximating the perimeters of the doped regions 110, 120. However, in one embodiment, the substrate 105 is a doped substrate, such that one of the doped regions 110, 120 is a region protected from doping processes employed to form the other of the doped regions 110, 120. For example, the substrate 105 may be a P doped substrate, such that the doped region 110 is a P doped region, and the doped region 120 may be an N doped region formed by implanting N type impurities into the substrate 105 through a mask substantially covering the doped region 110.

The device 100 may also include isolation features 130 proximate interfaces between the doped regions 110, 120. The isolation features 130 may be or comprise field oxide regions, shallow trench isolation (STI), deep trench isolation, local oxidation of silicon (LOCOS), and/or other electrically insulating features. The isolation features 130 may comprise silicon dioxide and/or other materials, and may be formed by chemical-vapor deposition (CVD), plasma-enhanced CVD (PECVD), physical-vapor deposition (PVD), atomic layer deposition (ALD), and/or other processes.

The device 100 also includes a gate oxide layer 140 located over the substrate 105 and isolation features 130. The gate oxide layer 140 may comprise $SiO_2$, $Ta_2O_5$, $Hf_2O$, $ZrO_2$, and/or other dielectric materials, and may be formed by ALD, CVD, PECVD, PVD, thermal or rapid-thermal-processing (RTP) oxidation, epitaxial growth, in-situ steam generation (ISSG) RTP oxidation, and/or other processes. The gate oxide layer 140 may have a thickness of about 100 angstroms or less.

A metal layer 150 is formed over the gate oxide layer 140. The metal layer 150 may comprise molybdenum, hafnium, cobalt, nickel, tungsten, vanadium, bismuth, titanium, tantalum, aluminum, silicide, alloys thereof, and/or other materials, and may be formed by CVD, PECVD, PVD, ALD, electro-plating, and/or other processes. The metal layer 150 may also comprise more than one layer, possibly including layers of different materials.

A semiconductor layer 160 is formed over the metal layer 150. However, the semiconductor layer 160 may only be formed over a region of the metal layer 150 substantially conforming or corresponding to the perimeter of the doped region 120. In one embodiment, the semiconductor layer 160 is formed by blanket deposition, thereby substantially covering the metal layer 150, and is subsequently patterned to substantially conform or otherwise correspond to the perimeter of the doped region 120. For example, the semiconductor layer 160 may be patterned by one or more wet, dry, chemical, and/or plasma etching processes. Photolithography may also or alternatively be employed to pattern the semiconductor layer 160. The semiconductor layer 160 may comprise amorphous silicon, polysilicon, polyoxide, silicon nitride, silicon dioxide, silicon carbide, and/or other materials, and may be formed by CVD, PECVD, PVD, ALD, and/or other processes. The semiconductor layer 160 may also comprise more than one layer, possibly including layers of different materials. In one embodiment, the semiconductor layer 160 has a crystalline orientation other than <100>. For example, the semiconductor layer 160 may have a <110> or <111> crystalline orientation. However, any crystalline orientation is within the scope of the present application.

Figure 2:
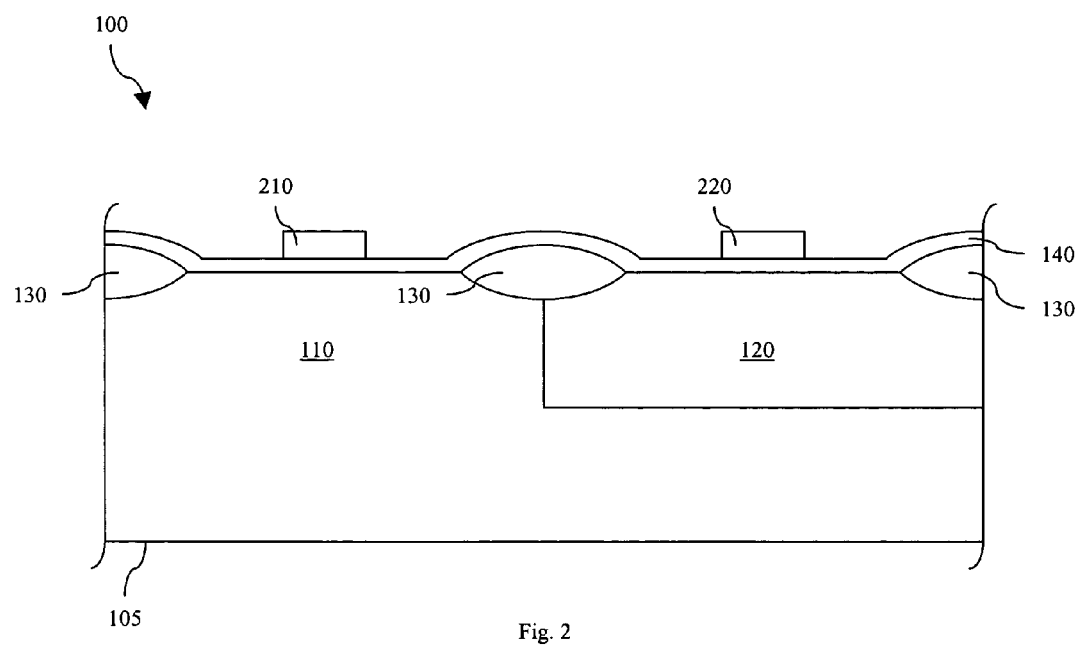
FIG. 2 is a sectional view of the device shown in FIG. 1 in a subsequent stage of manufacture.

Referring to FIG. 2 with continued reference to FIG. 1, illustrated is a sectional view of the microelectronic device 100 shown in FIG. 1 in a subsequent stage of manufacture according to aspects of the present disclosure. An anneal or other thermal process can be employed to react the semiconductor layer 160 and the metal layer 150 over the doped region 120, thereby forming a composite layer. The thermal process may be a rapid thermal anneal, and may be performed at temperatures ranging between about 400° C. and about 800° C., possibly for a time period ranging between about 10 seconds and about 1 hour. The thermal process may be performed in an inert process environment, such as one substantially comprising nitrogen, argon, helium, and/or other gases. A sintering process may also or alternatively be employed to react the metal layer 150 and the semiconductor layer 160. The thermal processing is configured to react the metal layer 150 and the semiconductor layer 160 over the doped region 120, thereby forming the composite layer comprising, for example, molybdenum silicide, hafnium silicide,. cobalt silicide, nickel silicide, tungsten silicide, and/or other compositions.

After the thermal processing described above, the metal layer 150 is patterned to form a metal gate electrode 210 over the doped region 110, and the composite layer resulting from the reaction of the metal layer 150 and the semiconductor layer 160 is patterned to form a composite gate electrode 220 over the doped region 120. For example, the electrodes 210, 220 may be defined by a patterning process comprising one or more wet, dry, chemical, and/or plasma etching processes. Photolithography may also or alternatively be employed to define the electrodes 210, 220. However, in one embodiment, the patterning performed to define the metal gate electrode 210 and the composite gate electrode 220 may be performed prior to performing the thermal processing employed to react the metal layer 150 and the semiconductor layer 160. Moreover, the thermal processing may also be performed both prior to and after the electrodes 210, 220 are defined by patterning.

In one embodiment, the work functions of the metal gate electrode 210 and the composite gate electrode 220 may differ by about 0.676 eV. For example, the metal layer 150 may substantially comprise molybdenum and the semiconductor layer 160 may substantially comprise amorphous silicon (at least prior to annealing), such that the metal gate electrode 210 substantially comprises molybdenum and the composite gate electrode 220 substantially comprises molybdenum silicide, wherein the molybdenum electrode 210 has a work function that differs from the work function of the molybdenum silicide electrode 220 by about 0.676 eV.

FIG. 2 may not represent a completed stage of manufacture of the device 100. For example, various additional manufacturing processes may be employed after the gate electrodes 210, 220 are defined, including processes employed to form an interconnect structure interconnecting portions of the device 100 internally and to external devices.

Figure 3:
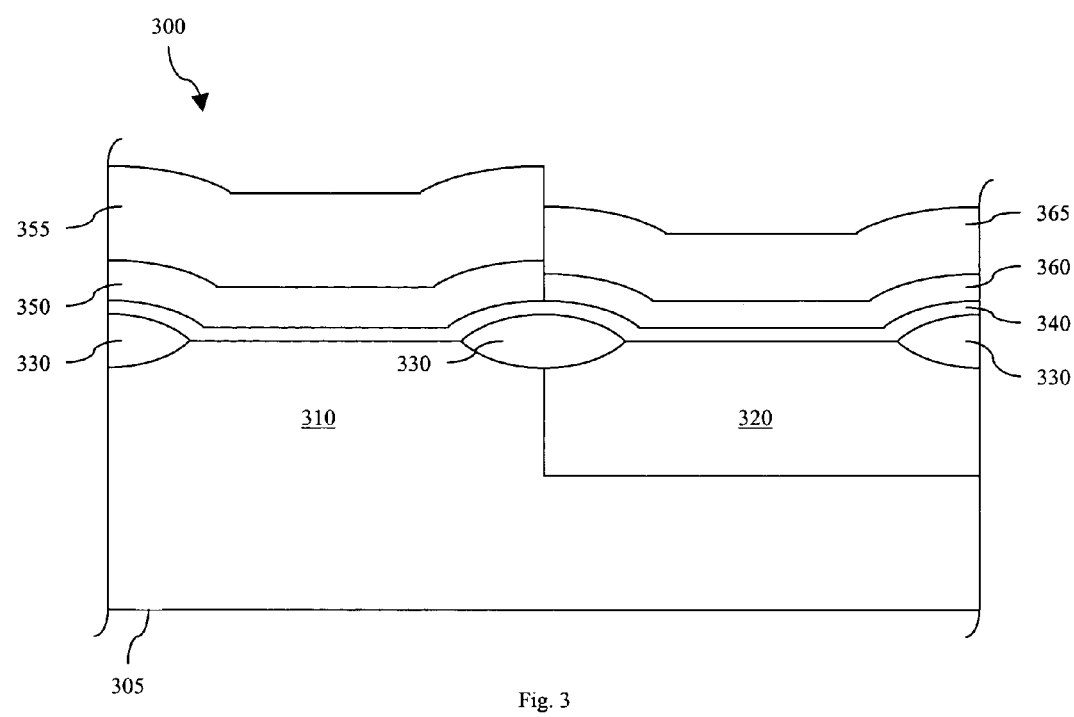
FIG. 3 is a sectional view of at least a portion of another embodiment of a microelectronic device in an intermediate stage of manufacture according to aspects of the present disclosure.

Referring to FIG. 3, illustrated is a sectional view of at least a portion of another embodiment of a microelectronic device 300 in an intermediate stage of manufacture according to aspects of the present disclosure. The device 300 includes doped regions 310, 320 formed in a substrate 305. The substrate 305 may comprise silicon, gallium arsenide, gallium nitride, strained silicon, silicon germanium, silicon carbide, carbide, diamond, and/or other materials. A bulk portion of the substrate 305 may be doped with a P type and/or an N type dopant. In one embodiment, the substrate 305 comprises an SOI substrate, such as a silicon-on-sapphire substrate, a silicon germanium-on-insulator substrate, or another substrate comprising an epitaxial semiconductor layer on an insulator layer. The substrate 305 may also or alternatively comprise a fully depleted SOI substrate having an active layer thickness ranging between about 5 nm and about 200 nm. The substrate 305 may also or alternatively comprise an air gap, such as may be formed in an SON structure.

The doped regions 310, 320 may be regions formed by implanting impurities into the substrate 305 employing a mask defining or approximating the perimeters of the doped regions 310, 320. However, in one embodiment, the substrate 305 is a doped substrate, such that one of the doped regions 310, 320 is a region protected from doping processes employed to form the other of the doped regions 310, 320. For example, the substrate 305 may be a P doped substrate, such that the doped region 310 is a P doped region, and the doped region 320 may be an N doped region formed by implanting N type impurities into the substrate 305 through a mask substantially covering the doped region 310.

The device 300 may also include isolation features 330 proximate interfaces between the doped regions 310, 320. The isolation features 330 may be or comprise field oxide regions, STI, deep trench isolation, LOCOS, and/or other electrically insulating features. The isolation features 330 may comprise silicon dioxide and/or other materials, and may be formed by CVD, PECVD, PVD, ALD, and/or other processes.

The device 300 also includes a gate oxide layer 340 located over the substrate 305 and isolation features 330. The gate oxide layer 340 may comprise $SiO_2$, $Ta_2O_5$, $Hf_2O$, $ZrO_2$, and/or other dielectric materials, and may be formed by ALD, CVD, PECVD, PVD, thermal or RTP oxidation, epitaxial growth, ISSG RTP oxidation, and/or other processes. The gate oxide layer 340 may have a thickness of about 100 angstroms or less.

Metal layers 350, 355 are formed over the gate oxide layer 340 over an area substantially conforming or corresponding to the doped region 310. Each of the metal layers 350, 355 may comprise molybdenum, hafnium cobalt, nickel, tungsten, vanadium, bismuth, titanium, tantalum, aluminum, silicide, alloys thereof, and/or other materials, and may be formed by CVD, PECVD, PVD, ALD, electro-plating, and/or other processes. In one embodiment, the metal layers 350, 355 comprise different metals. For example, one of the metal layers 350, 355 may substantially comprise hafnium, and the other of the metal layers 350, 355 may substantially comprise molybdenum. Each of the metal layers 350, 355 may also comprise more than one layer, possibly including layers of different materials. The metal layers 350, 355 may have substantially different or substantially similar thicknesses.

Metal layers 360, 365 are also formed over the gate oxide layer 340 over an area substantially conforming or corresponding to the doped region 320. Each of the metal layers 360, 365 may comprise molybdenum, hafnium cobalt, nickel, tungsten, vanadium, bismuth, titanium, tantalum, aluminum, silicide, alloys thereof, and/or other materials, and may be formed by CVD, PECVD, PVD, ALD, electroplating, and/or other processes. In one embodiment, the metal layers 360, 365 comprise different metals. For example, one of the metal layers 360, 365 may substantially comprise hafnium, and the other of the metal layers 360, 365 may substantially comprise molybdenum. Each of the metal layers 360, 365 may also comprise more than one layer, possibly including layers of different materials. In one embodiment, the metal layers 350, 360 comprise substantially similar materials, and the metal layers 355, 365 comprise substantially similar materials. The metal layers 360, 365 nay have substantially different or substantially similar thicknesses. One or more of the metal layers 360, 365 and one or more of the metal layers 350, 355 may also be substantially similar, although in one embodiment the metal layers 350, 355, 360, 365 each have substantially different thicknesses.

The metal layers 350, 355 may also be formed by co-sputtering with targets of different materials. For example, the partially completed device 300 may be placed in a sputtering chamber having first and second metal targets, such as a molybdenum-containing target and a hafnium-containing target. During the co-sputtering process, the sputtering power independently applied to the first and second targets may be varied such that the amount of each metal deposited at any point during the co-sputtering process may be adjusted.

In one embodiment, power may only be applied to the first target during a first sputtering stage, thereby forming the metal layer 350, and power may only be applied to the second target during a second sputtering stage, thereby forming the metal layer 355. In another embodiment, the power applied to the first target may be gradually and/or incrementally decreased during sputtering, and the power applied to the second target may be gradually and/or incrementally increased during sputtering. Consequently, a composite metal layer may be formed instead of and/or in addition to the metal layers 350, 355, wherein the composite metal layer has a composition gradient having a higher concentration of the first metal at first-formed surface, a higher concentration of the second metal at the last-formed surface, and substantial proportions of the first and second metal at an intermediate point central to the composite layer thickness.

Thus, in one embodiment, the metal layers 350, 355 may collectively be or comprise a single, composite layer having a greater concentration of a first metal, such as molybdenum, adjacent or proximate the gate oxide layer 340, and having a greater concentration of a second metal, such as hafnium, distal from the gate oxide layer 340. The power applied to the first and second metal targets during the co-sputtering processing may also be varied to form the composite layer with a predetermined composition gradient, such as a linear, exponential, quadratic, hyperbolic, parabolic, or other non-linear composition gradient.

Moreover, co-sputtering processes such as those described above may also be employed to form the metal layers 360, 365, such that the metal layers 360, 365 may also be or comprise a single, composite layer having a greater concentration of a first metal adjacent or proximate the gate oxide layer 340 and having a greater concentration of a second metal distal from the gate oxide layer 340. In one embodiment, the composition gradient of the metal layers 360, 365, or the composite layer formed thereby, may be different than the composition gradient of the metal layers 350, 355, or the composite layer formed thereby. References hereafter to the metal layers 350, 355, or the metal layers 360, 365, also contemplate the compositely formed layers having composition gradients described above.

Figure 4:
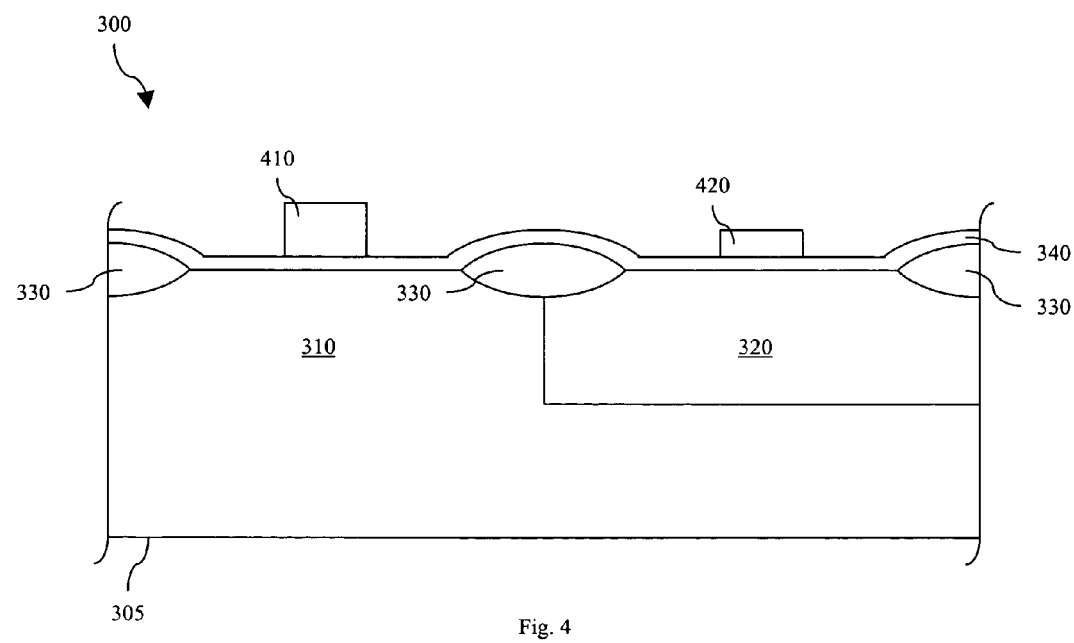
FIG. 4 is a sectional view of the device shown in FIG. 3 in a subsequent stage of manufacture.

Referring to FIG. 4 with continued reference to FIG. 3, illustrated is a sectional view of the microelectronic device 300 shown in FIG. 3 in a subsequent stage of manufacture according to aspects of the present disclosure. An anneal or other thermal process is employed to react the metal layers 350, 355 over the doped region 310 and the metal layers 360, 365 over the doped region 320, thereby forming composite layers over each of the doped regions 310, 320. The thermal process may be a rapid thermal anneal, and may be performed at temperatures ranging between about 400° C. and about 800° C., possibly for a time period ranging between about 10 seconds and about 1 hour. The thermal process may be performed in an inert process environment, such as one substantially comprising nitrogen, argon, helium, and/or other gases. A sintering process may also or alternatively be employed to react the metal layers 350, 355 and the metal layers 360, 365.

After the thermal processing described above, the composite metal layers resulting from the thermal processing are patterned to form a composite metal gate electrode 410 over the doped region 310 and a composite metal gate electrode 420 over the doped region 320. The composite metal gate electrodes 410, 420 may be patterned from the composite layers by one or more wet, dry, chemical, and/or plasma etching processes. Photolithography may also or alternatively be employed to define the composite metal gate electrodes 410, 420. In one embodiment, the patterning performed to define the composite metal gate electrodes 410, 420 may be performed prior to performing the thermal processing to react the metal layers 350, 355, 360, 365, such that a first stack is defined from the metal layers 350, 355 over the doped region 310 and a second stack is defined from the metal layers 360, 365 over the doped region 320. Moreover, the thermal processing may also be performed both prior to and after the electrodes 410, 420 are defined by patterning.

The composite metal gate electrodes 410, 420 may each have a thickness ranging between about 100 angstroms and about 2000 angstroms. In one embodiment, such as in the illustrated embodiment, the composite metal gate electrodes 410, 420 have different thicknesses. For example, the composite metal gate electrode 410 may have a thickness that is about 50% to about 200% greater than the thickness of the composite metal gate electrode 420. In one embodiment, the thickness of the composite metal gate electrode 410 is about twice the thickness of the composite metal gate electrode 420.

In one embodiment, the work functions of the composite metal gate electrodes 410, 420 may differ by about 0.676 eV. For example, the composite metal gate electrode 410 may comprise a greater concentration of a first metal, such as molybdenum, relative to the composite metal gate electrode 420, and/or the composite metal gate electrode 420 may comprise a greater concentration of a second metal, such as hafnium, relative to the composite metal gate electrode 410, thereby establishing a work function differential between the composite metal gate electrodes 410, 420.

FIG. 4 may not represent a completed stage of manufacture of the device 300. For example, various additional manufacturing processes may be employed after the composite metal gate electrodes 410, 420 are defined, including processes employed to form an interconnect structure interconnecting portions of the device 300 internally and to external devices.

Figure 5:
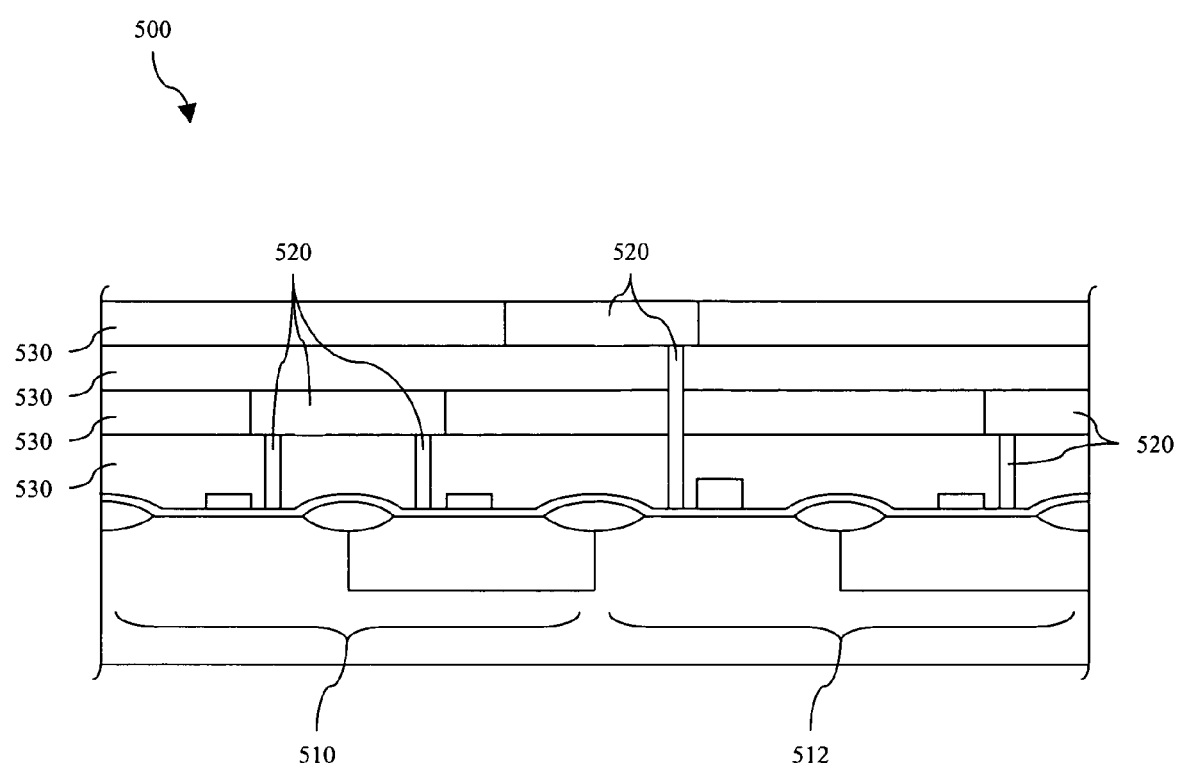
FIG. 5 is a sectional view of at least a portion of one embodiment of an integrated circuit device according to aspects of the present disclosure.

Referring to FIG. 5, illustrated is a sectional view of at least a portion of one embodiment of an integrated circuit device 500 according to aspects of the present disclosure. The integrated circuit device 500 is one environment in which aspects of the microelectronic device 100 shown in FIG. 2 and/or the microelectronic device 300 shown in FIG. 4 may be implemented. For example, the integrated circuit includes a plurality of microelectronic devices 510, 512 located in and/or on a substrate 505. One or more of the microelectronic devices 510, 512 may be substantially similar to the device 100 shown in FIG. 2 and/or the device 300 shown in FIG. 4. In the illustrated embodiment, the microelectronic device 510 is substantially similar to the device 100 shown in FIG. 2, and the microelectronic device 512 is substantially similar to the device 300 shown in FIG. 4. However, the integrated circuit device 500 may also include more than the two microelectronic devices 510, 512 shown in FIG. 5, including devices other than those similar to the devices 100 and 300 shown in FIGS. 2 and 4, respectively.

The integrated circuit device 500 also includes interconnects 520 extending along and/or through one or more dielectric layers 530 to ones of the plurality of microelectronic devices 510, 512. The interconnects 520 may comprise copper, tungsten, gold, aluminum, carbon nano-tubes, carbon fullerenes, refractory metals and/or other materials, and may be formed by CVD, PECVD, ALD, PVD, and/or other processes. The dielectric layers 530 may comprise silicon dioxide, BLACK DIAMOND (a product of Applied Materials of Santa Clara, Calif.), and/or other materials, and may be formed by CVD, PECVD, ALD, PVD, spin-on coating, and/or other processes. The dielectric layers 530 may have a thickness ranging between about 2000 angstroms and about 15,000 angstroms.

Thus, the present disclosure provides a method of manufacturing transistor gate electrodes including, in one embodiment, forming a metal layer over first and second regions of a substrate, wherein the first and second regions have different first and second dopant types, respectively. A semiconductor layer is formed over at least a portion of the second region. The metal layer is heated to form a metal gate electrode over the first region, and the metal layer and the semiconductor layer are collectively heated to form a composite metal gate electrode over the second region.

The present disclosure also introduces a microelectronic device including, in one embodiment, a substrate having first and second doped regions of different first and second dopant types, respectively. A metal gate electrode is located over the first doped region, and a composite metal electrode is located over the second doped region.

Another embodiment of a method of manufacturing gate electrodes according to aspects of the present disclosure includes forming a first metal layer having a first thickness over a first region of a substrate, forming a second metal layer having a second thickness over the first metal layer, forming a third metal layer having a third thickness over a second region of the substrate, and forming a fourth metal layer having a fourth thickness over the third metal layer, wherein the first and second regions have first and second dopant types, respectively. The first and second metal layers are heated to form a first composite metal gate electrode, and the third and fourth metal layers are heated to form a second composite metal gate electrode. The first and second thicknesses are collectively substantially different from the third and fourth thicknesses, collectively.

Another method of manufacturing gate electrodes according to aspects of the present disclosure includes forming a first composite metal layer over a first region of a substrate by co-sputtering, in which power applied to first and second targets is adjusted to form a first composition gradient in the first composite metal layer. A second composite metal layer is formed over a second region of the substrate by co-sputtering, in which power applied to third and fourth targets is adjusted to form a second composition gradient in the second composite metal layer. The first and second regions have first and second dopant types, respectively. The first and second composite metal layers are heated and patterned to form first and second composite metal gate electrodes.

The foregoing has outlined features of several embodiments according to aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of manufacturing gate electrodes, comprising
 forming a first metal layer having a first thickness over a first region of a substrate;
 forming a second metal layer having a second thickness over the first metal layer;
 forming a third metal layer having a third thickness over a second region of the substrate, wherein the first and second regions have first and second dopant types, respectively;
 forming a fourth metal layer having a fourth thickness over the third metal layer;
 heating and patterning the first and second metal layers to form a first composite metal gate electrode; and
 heating and patterning the third and fourth metal layers to form a second composite metal gate electrode;
 wherein the first and second thicknesses are collectively substantially different from the third and fourth thicknesses, collectively.

2. The method of claim 1 wherein the first and third metal layers are substantially similar in composition.

3. The method of claim 1 wherein the second and fourth metal layers are substantially similar in composition.

4. The method of claim 1 further comprising patterning the first, second, third, and fourth metal layers to form a first stack over the first region and a second stack over the second region.

5. The method of claim 1 wherein the second thickness is substantially different from the fourth thickness.

6. The method of claim 1 wherein the first and third thicknesses are substantially similar.

7. The method of claim 1 wherein the first and second metal layers are formed by co-sputtering.

8. The method of claim 7 wherein:
 co-sputtering to form the first metal layer employs a first power level applied to a first target during a first time period and a second power level applied to a second target during the first time period; and co-sputtering to form the second metal layer employs a third power level applied to the first target during a second time period and a fourth power level applied to the second target during the second time period, wherein:

the first power level is substantially greater than the third power level;

the second power level is substantially less than the fourth power level; and the second time period is temporally after the first time period.

9. The method of claim 7 wherein the third and fourth metal layers are formed by co-sputtering.

10. The method of claim 9 wherein:

co-sputtering to form the third metal layer employs a fifth power level applied to a third target during a third time period and a sixth power level applied to a fourth target during the third time period; and co-sputtering to form the fourth metal layer employs a seventh power level applied to the third target during a fourth time period and an eighth power level applied to the fourth target during the fourth time period, wherein:

the fifth power level is substantially greater than the seventh power level;

the sixth power level is substantially less than the eighth power level; and the fourth time period is temporally after the third time period.

11. The method of claim 1 wherein the first and third metal layers comprise a first metal and the second and third metal layers comprise a second metal.

12. The method of claim 11 wherein the first metal is hafnium and the second metal is molybdenum.

13. The method of claim 11 wherein the first metal is molybdenum and the second metal is hafnium.

14. A method of manufacturing gate electrodes, comprising forming a first composite metal layer over a first region of a substrate by co-sputtering in which power applied to first and second targets is adjusted to form a first composition gradient in the first composite metal layer;

forming a second composite metal layer over a second region of the substrate by co-sputtering in which power applied to third and fourth targets is adjusted to form a second composition gradient in the second composite metal layer, wherein the first and second regions have first and second dopant types, respectively; and heating and patterning the first and second composite metal layers to form first and second composite metal gate electrodes.

15. The method of claim 14 wherein the first and second composition gradients are substantially different.

16. The method of claim 14 wherein the first composite metal layer has a first thickness after the heating and the second composite metal layer has a second thickness after the heating, wherein the first and second thicknesses are substantially different.

17. The method of claim 14 wherein the first and third targets are hafnium-containing targets and the second and fourth targets are molybdenum-containing targets.

18. The method of claim 17 wherein the first and second composition gradients are substantially different gradients of the relative proportions of hafnium and molybdenum in the first and second composite metal layers.

19. The method of claim 14 wherein at least one of the first and second composition gradients is a substantially linear gradient.

20. The method of claim 14 wherein at least one of the first and second composition gradients is a substantially exponential gradient.

21. The method of claim 14 wherein at least one of the first and second composition gradients is a substantially parabolic gradient.

22. The method of claim 14 wherein at least one of the first and second composition gradients is a substantially hyperbolic gradient.

* * * * *